US009756750B2

(12) United States Patent
Samuels et al.

(10) Patent No.: US 9,756,750 B2
(45) Date of Patent: Sep. 5, 2017

(54) FOUR-POINT TETHERED O-RING FOR REMOVABLE COVER

(71) Applicant: Netgear, Inc., San Jose, CA (US)

(72) Inventors: Bruce Samuels, Lions Bay (CA); Andrew Tetzel, Vancouver (CA)

(73) Assignee: Netgear, Inc., San Jose, CA (US)

( * ) Notice: Subject to any disclaimer, the term of this patent is extended or adjusted under 35 U.S.C. 154(b) by 47 days.

(21) Appl. No.: 15/010,375

(22) Filed: Jan. 29, 2016

(65) Prior Publication Data

US 2017/0223853 A1 Aug. 3, 2017

(51) Int. Cl.
| G06F 1/16 | (2006.01) |
| H05K 5/06 | (2006.01) |
| F16J 15/02 | (2006.01) |
| F16J 15/06 | (2006.01) |
| F16J 15/10 | (2006.01) |
| H05K 5/03 | (2006.01) |
| G06F 1/18 | (2006.01) |

(52) U.S. Cl.
CPC ......... H05K 5/061 (2013.01); F16J 15/022 (2013.01); F16J 15/061 (2013.01); F16J 15/102 (2013.01); F16J 15/104 (2013.01); G06F 1/1656 (2013.01); G06F 1/181 (2013.01); H05K 5/03 (2013.01)

(58) Field of Classification Search
CPC ........ H05K 5/061; G06F 1/1656; G06F 1/181
USPC ........................................ 361/679.55, 679.56
See application file for complete search history.

(56) References Cited

U.S. PATENT DOCUMENTS

| 5,687,975 | A | * | 11/1997 | Inciong | ............... | F02F 7/006 |
| | | | | | | 277/591 |
| 5,844,772 | A | * | 12/1998 | Lee | .................. | G06F 1/1626 |
| | | | | | | 361/679.26 |
| 6,561,522 | B1 | * | 5/2003 | Radelet | ............... | F16J 15/021 |
| | | | | | | 277/314 |
| 6,888,591 | B2 | * | 5/2005 | Kim | ................ | G02F 1/133308 |
| | | | | | | 349/58 |
| 7,697,269 | B2 | * | 4/2010 | Yang | ................. | B29C 65/58 |
| | | | | | | 361/679.01 |
| 7,828,302 | B2 | * | 11/2010 | Hurlbert | .............. | F16J 15/125 |
| | | | | | | 277/637 |
| 8,937,246 | B2 | * | 1/2015 | Yamaguchi | ......... | H05K 5/061 |
| | | | | | | 174/50 |
| 9,462,098 | B2 | * | 10/2016 | Chang | ............... | H04M 1/0249 |
| 9,615,476 | B2 | * | 4/2017 | Rayner | ............... | H05K 5/061 |
| 2010/0265656 | A1 | * | 10/2010 | Yamaguchi | ........ | G06F 1/1616 |
| | | | | | | 361/679.55 |
| 2016/0262272 | A1 | * | 9/2016 | Oba | ..................... | H05K 1/18 |

* cited by examiner

Primary Examiner — Nidhi Thaker
(74) Attorney, Agent, or Firm — Boyle Fredrickson, S.C.

(57) ABSTRACT

An electronic device and/or a method of sealing said device are configured for ease of installation and use. The electronic device has a housing having a recess, a cover concealing the recess and having walls extending circumferentially around the cover and having a channel formed in the outer surface thereof, and at least two through-holes formed through the channel, and an O-ring having a body with at least two tethers each of which passes through a respective hole in the cover.

15 Claims, 7 Drawing Sheets

FOUR-POINT TETHERED O-RING FOR REMOVABLE COVER

BACKGROUND OF THE INVENTION

1. Field of the Invention

The invention relates generally to sealed electronic devices, and more particularly, relates to a method and/or apparatus for sealing a cover to an electronic device such as a mobile hotspot, mobile phone, or hand held appliance with a sealing O-ring. The invention additionally relates to an O-ring usable as such a seal.

2. Discussion of the Related Art

Many electronic devices have covers that must be sealed from unwanted environmental contaminants, such as ingress of water and dust. The electronic components can be damaged by water or dust entering the encasement. Thus, there is a need and desire to make electronic devices at least somewhat waterproof and air tight.

In order to satisfy this need, electronic devices require a sealed housing or encasement for protecting the electrical components held within the housing interior. Known devices use radial seals, such as O-rings or gaskets, or welded plastic housings in order to provide a sealed housing. When it is desired for an interior of the housing, such as a battery compartment, to be accessible, a radial seal is more likely to be used than welded plastic.

A typical radially-sealed housing uses an O-ring surrounding a cover's circumference. In order to install the O-ring around the cover's circumference, a manufacturer must typically stretch the O-ring around the circumference of the cover and then push the O-ring into the corners of the cover, typically using a small tool. This procedure often results in the O-ring getting twisted during application and/or being unevenly stretched around the cover. Both of these problems may result in an ineffectual sealing of the cover to the housing. Moreover, the O-ring may be accidentally displaced from the cover by the user when removing and reinstalling the cover.

In light of the foregoing, an apparatus and/or method for sealing a cover to an electronic device, which provides even installation of an O-ring around the cover, is desired.

Also, an apparatus and/or method for sealing an electronic device, which prevents unwanted movement or shifting of the O-ring after installation, is desired.

Also, an apparatus and/or method for sealing an electronic device which adequately seals the corners of the cover is desired.

Also, an apparatus and/or method for sealing an electronic device, which simplifies and reduces the time for installing the O-ring onto the cover, is desired.

SUMMARY OF THE INVENTION

One or more of the above-identified needs are met by providing a method of sealing an electronic device including the steps of: providing a housing presenting an opening bounded by circumferential walls, and a cover having walls extending circumferentially around the cover and positionable within the circumferential walls of the housing, the walls of the cover having a channel extending around a perimeter of the cover and at least two holes formed therethrough. The method further entails providing an O-ring having a body and at least two tethers extending inwardly from the body, inserting the tethers on the O-ring through corresponding holes in the circumferential walls of the cover, stretching the O-ring around the peripheral walls of the channel, and placing the cover over the opening so that the O-ring creates a seal between the walls of the housing and the walls of the cover. "Circumferentially" means to extend around the circumference of the associated element, while other walls could be provided inboard and/or outboard of the "circumferential" walls.

In one embodiment, a first tether may be positioned at an opposite leg of the O-ring as a second tether and a first hole is positioned at an opposite end of the cover as a second hole. The method may further include inserting the first tether into the first hole and inserting the second tether into the second hole.

In one embodiment, a third tether may be positioned at an opposite end of the O-ring as a fourth tether, and a third hole may be positioned at an opposite side of the cover as a fourth hole. The method may further comprise inserting the third tether into the third hole and the fourth tether into the fourth hole.

In one embodiment, the cover is rectangular and the O-ring body has an at least generally rectangular shape prior to stretching, i.e. in its related state.

In one embodiment, corners of the O-ring body are molded to conform to corners of the cover.

In one embodiment, the method further comprises the step of pulling a locking barb of the tethers, with an area greater than an area of the holes, through said holes until the locking barb is at the opposite side of the channel.

In one embodiment, the tethers are longer than a depth of the holes so as to extend outward from an opposite side of the holes.

In one embodiment, the method further comprises the step of trimming a distal end of each tether while leaving the tether locking barb intact.

In accordance with another aspect of the invention, an electronic device has a housing having a recess, a cover concealing the recess and having walls extending circumferentially around the cover and having a channel formed in an outer surface thereof, and at least two through-holes formed through the walls of the channel. An O-ring is provided having a body with at least two tethers, each of which passes through a respective hole in the cover.

In one embodiment, the first and second tethers take a first cross-sectional shape and the third and fourth tethers take a second cross-sectional shape which is different from the first cross-sectional shape.

In one embodiment, one of the first and second cross-sectional shapes is circular and the other of the first and second cross-sectional shapes is non-circular.

These and other objects, advantages, and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE PREFERRED EMBODIMENTS

A wide variety of sealing mechanisms could be constructed in accordance with the invention as defined by the claims. Any one of these mechanisms could be used in conjunction with any of a number of electronic devices, such as mobile hotspots, mobile phones, or any of a number of hand-held appliances. Hence, while the preferred embodiments of the invention will now be described with reference to a sealing cover assembly for use with a mobile hotspot, it should be understood that the invention is in no way so limited.

Figure 1:
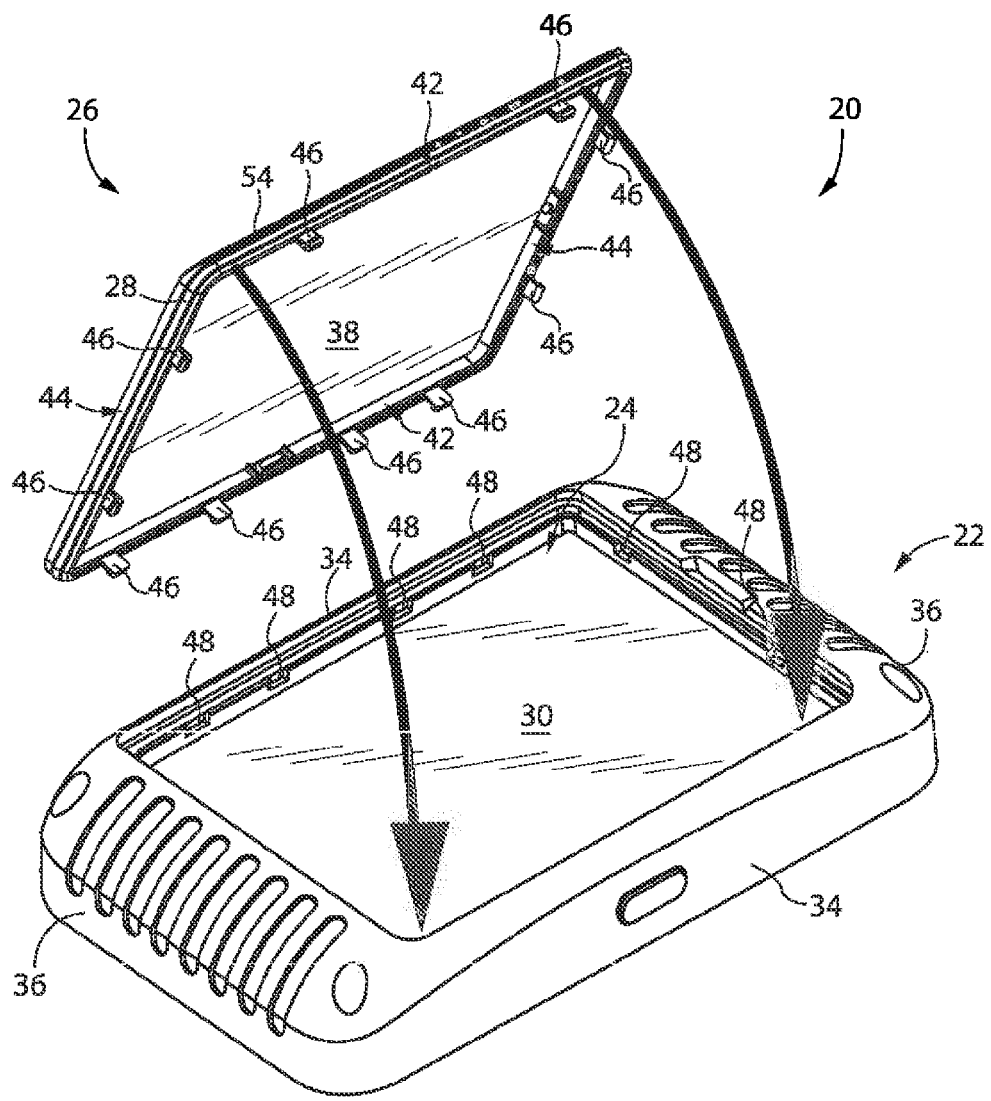
FIG. 1 is an isometric view of a mobile hotspot device, viewed from a location above the electronic device, and showing a cover removed from the battery compartment.

FIG. 1 is an isometric view of an electronic device 20, for example, a mobile hotspot, enclosed within a casing or housing 22. The housing 22 presents an internal opening 24 or recess for receiving the device's 20 components (not shown) such as a battery and electronic circuitry. The opening 24 is selectively closed by a cover 26 which is sealed to the housing 22 by an O-ring 28.

Still referring to FIG. 1, the housing 22 may be a plastic molded enclosure defining the opening 24. The opening 24 of this embodiment is rectangular in shape. It is bounded on one surface by a planar major wall 30 or surface of the housing 22 and at its perimeter by first through fourth sidewalls 34, 36. The major wall 30 or surface may be continuous with the remainder of the housing 22 or may be formed of a different material, such as glass. Assuming the major wall 30 presents the front surface of the device 20, the sidewalls 34, 36 extend rearwardly from the front major wall 30 by a distance defining the depth of the opening 24. The sidewalls 34, 36 include two opposed relatively long major sidewalls 34 and two relatively long minor sidewalls 36. The dimensions and proportion of all of these features may vary from application to application. In the illustrated embodiment, the opening 24 is about 2.6 by 3.3 inches in area and, as defined by the length of the sidewalls 34 and 36, is about 0.2 inches deep.

Still referring to FIG. 1, the rear surface of the opening 24 is open to allow access to components within the opening 24 such as a battery (not shown). However, the opening 24 also potentially subjects the interior of the housing 22 to contaminants, such as water or dust ingress. As such, it is desired to enclose or cover the opening 24 with the cover 26. The cover 26 protects the interior components of the housing 22 from water and dust which may harm the interior electrical components. It is also sealed to the housing 22 by the O-ring 28.

Figure 2:
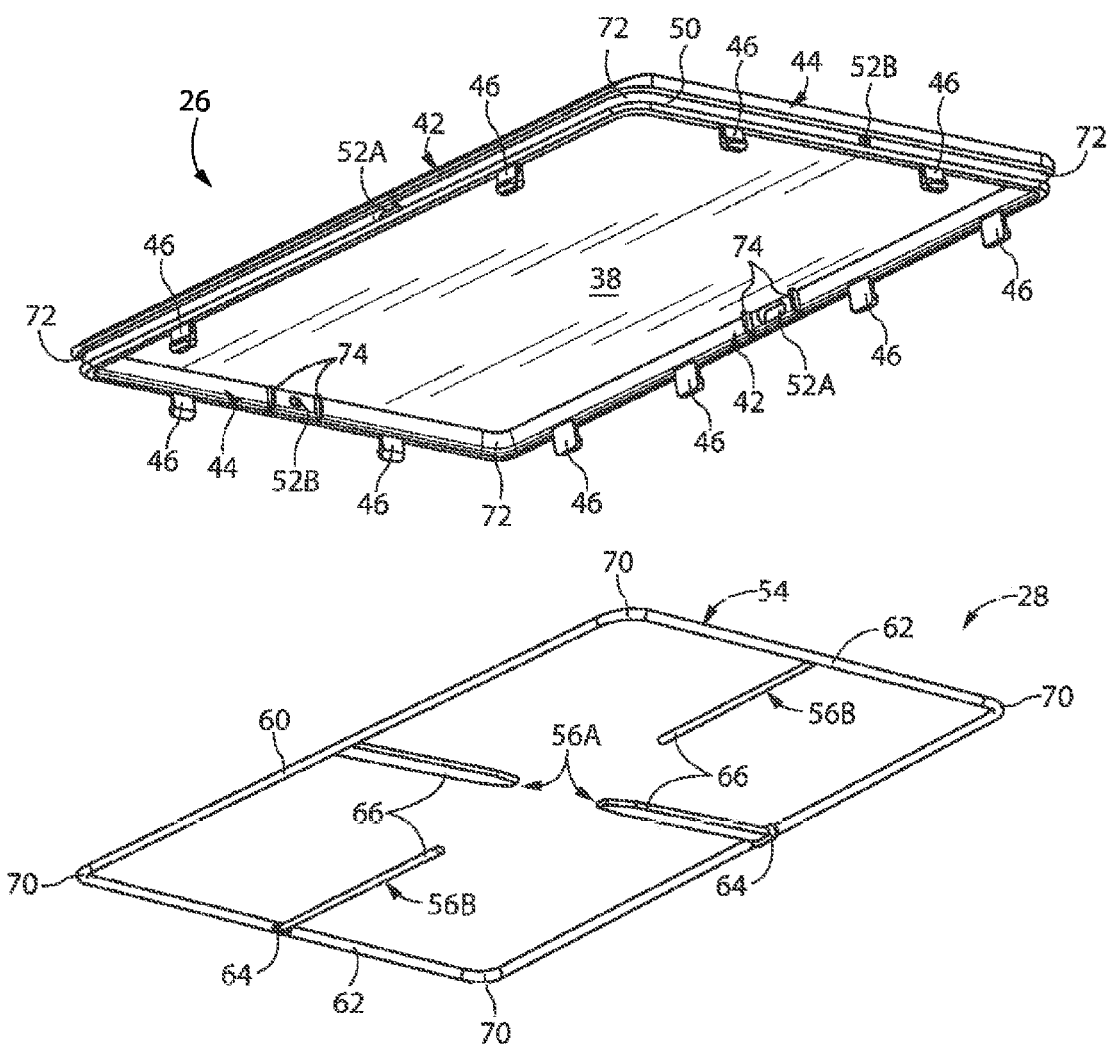
FIG. 2 is an isometric view of the cover, viewed from below the cover and showing an uninstalled O-ring separated from the cover.

Referring also to FIG. 2, an isometric view of the cover 26 viewed from below the cover 26 is shown, along with the O-ring 28. The cover 26, which may be injection-molded from a unitary piece of plastic, has a planar major wall 38 and circumferential side walls 42, 44. Assuming the major wall 38 forms the rear surface of the cover 26, the sidewalls extend forwardly from the major wall 38 by a distance that is substantially less than the depth of the housing walls 34, 36 but that is sufficient in length to receive the O-ring 28 in a channel 50 in the sidewalls 42, 44. The sidewalls 42, 44 of the cover 26 include two opposed relatively long major side walls 42 and two relatively long minor sidewalls 44. These sidewalls 42, 44 are sufficiently shorter than the corresponding sidewalls 34, 36 of the housing 22 to permit the sidewalls 42, 44 to nest within the opening 24 with a slight clearance between them and the corresponding housing sidewalls 34, 36. The dimensions and proportion of all of these features may vary from application to application. In the illustrated embodiment, the cover 26 is about 2.5 by 3.3 inches in area and the sidewalls 42, 44 are about 0.2 inches deep. The cover 26 may be coupled to the housing 22 by mating latches 46 (or hooks) and slots 48 and/or by fasteners such as screws (not shown), as is generally known in the art. It is understood that many coupling mechanisms are available to attach the cover 26 to the housing 22. Finally the channel 50 may extend circumferentially around the cover 26 and be formed by a groove in the outer surfaces of the sidewalls 42, 44. Through-holes 52A, 52B are formed in the channel 50 in least two, and possibly all four, of the sidewalls 42, 44. The channel 50 and holes 52A, 52B mate with the O-ring 28 as discussed in more detail below.

Still referring to FIG. 2, in order to seal the interface between the cover 26 and the housing 22, the O-ring 28 circumscribes an outer perimeter of the cover side walls 42, 44 to create a seal. The seal should be at least somewhat effective at inhibiting ingress of moisture, dust, or contaminates into the housing 22, and may form a hermetic or otherwise air and water tight seal, as will be described further below. The O-ring 28 is made of an elastomer, such as silicone rubber. It includes a body 54 forming a loop and a number of tethers 56A, 56B extending inwardly from the body 54. In one embodiment, the elastomer may have a durometer of 40-50 Shore A. It may have a modulus of elasticity between $0.145 \times 10^3$ and $7.25 \times 10^3$ which is functional at an operating temperature range of 0-70 degrees Celsius. However, it is understood that the O-ring 28 may be made of a variety of different materials and properties, and take on a variety of different cross-sectional shapes. For example, the hardness of the elastomer may vary depending on the desired compression ability for sealing the device. The operational temperature may be dependent on the device 20 and the environment of the device 20.

In order to facilitate the sealing process, the O-ring body 54 is shaped to generally correspond to the shape of the cover 26 as seen in FIG. 2. In one embodiment, the unstretched or relaxed O-ring body 54 may be at least generally rectangular in shape to correspond with a rectangular shaped cover 26 as shown. The illustrated O-ring body 54 may have four legs 60, 62 collectively forming a continuous loop. These legs 60, 62 include two oppositely disposed long or major legs 60 and two oppositely disposed short or minor legs 62. The legs 60, 62 are connected at generally right angles and may be somewhat rounded in the related state of the O-ring 28. It is understood, however, that the O-ring body 54 may be made to resemble any shape of the cover 26, such as a round O-ring body 54 to match a round cover 26 or an oblong O-ring body 54 to match an oblong cover 26, for example. The dimensional proportions of the rectangle formed by the O-ring body 54 may also correspond with the dimensional proportions of the sidewalls 42, 44 of the cover 26. In this respect, the lengths of the long legs 60 and short legs 62 of the O-ring body 54 would correspond proportionally to the lengths of the major 42 and minor 44 sidewalls of the cover 26. In this respect, the O-ring body 54 is made to proportionally fit around the sidewalls 42, 44 of the cover 26 when stretched and installed thereon.

Still referring to FIG. 2, it is understood that the unstretched or relaxed dimensions of the O-ring body 54 are less than those of the perimeter of sidewalls 42, 44 of the cover 26 so as to provide the proper tension of the O-ring body 54 on the cover 26 when installed. The ratio of the unstretched O-ring body 54 dimensions to the O-ring channel 50 may be approximately 70-80% and preferably greater than 70%.

Figure 3:
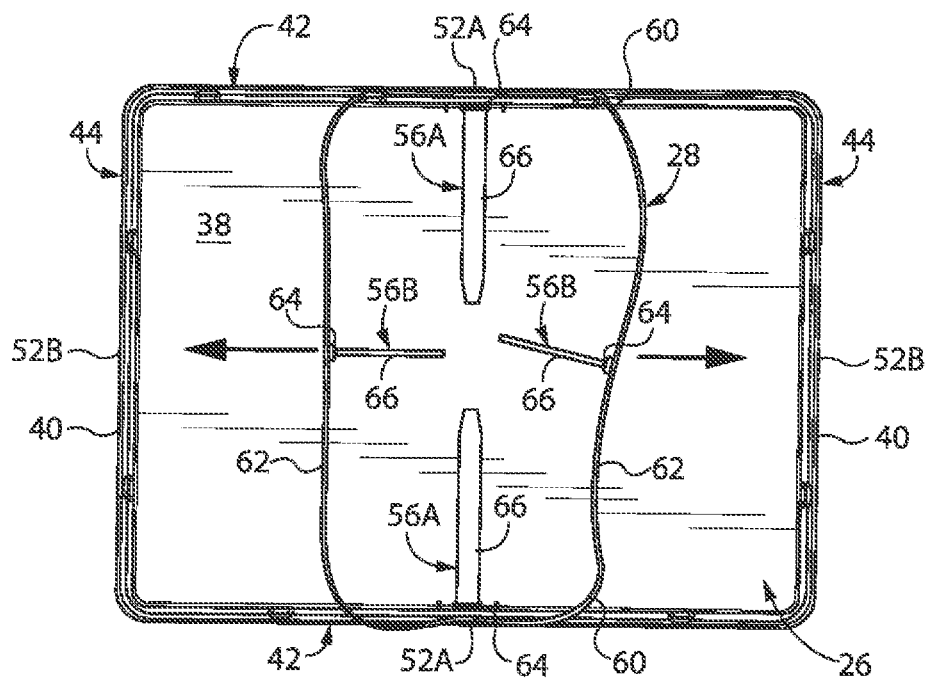
FIG. 3 is a bottom plan view of the cover, showing first and second tethers of the O-ring inserted into first and second holes of the long sides of the cover, respectively.
Figure 4:
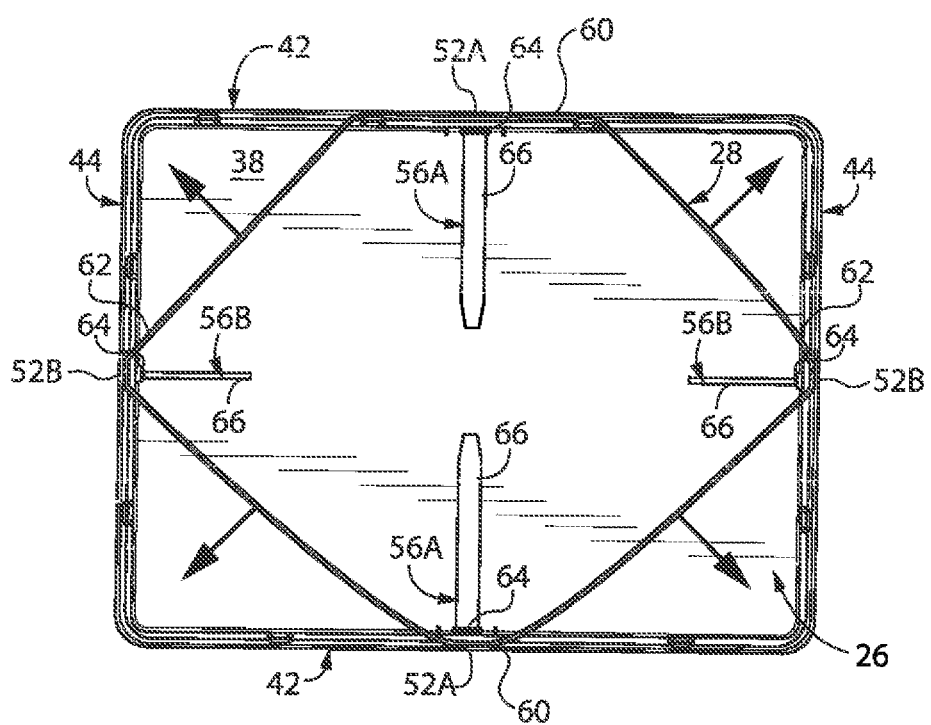
FIG. 4 is a bottom plan view of the rectangular cover following the step shown in FIG. 3, with third and fourth tethers of the O-ring inserted into third and fourth holes of the short sides of the cover, respectively.

Referring to FIGS. 2, 3 and 4, the tethers 56A and 56B extend inwardly from the body 54 of the O-ring 28 toward a center of the loop formed by the body 54. The tethers 56A, 56B are mateable with respective holes 52A, 52B formed in the sidewalls 42, 44 of the cover 26. There are preferably at least two tethers on opposite legs of the O-ring 28 from one another. The disclosed O-ring 28 has four tethers 56A, 56B—one of which is associated with each leg 60, 62 of the body 54. One tether 56A is provided on each long leg 60 of the body 54, and one tether 56B is provided on each short leg 62 of the body. Each tether 56A, 56B may be positioned at the center of the associated leg 60 or 62 of the O-ring body 54. The tethers 56A extend inwardly from the body 54 through less than half the width of the rectangle formed by the O-ring body 54 so as to provide a gap between opposing tethers 56A. The tethers 56B also extend a distance less than half the length of the rectangle formed by the O-ring body 54 so as to provide a gap between ends of the opposing tethers 56B.

Referring to combination of FIGS. 2, 4, 9, and 11. Each tether 56A, 56B comprises a relatively short stem 68 extending inwardly from the associated leg 60 or 62 of the O-ring body 54, a barb 64 disposed at an inner end of the stem 68, and a tether leader 66 (FIGS. 2 and 4) extending inwardly from the barb 64. The tether leader 66 of each tether 56A, 56B is eventually removed, as will be further discussed below. The undistorted length of each stem 68 preferably is less than the thickness of the associated cover sidewall 42 or 44 so that the O-ring body 54 is tensioned against the outer surface of the cover sidewall 42 or 44 when the barb 64 is pulled through the associated hole 52A or 52B in the cover sidewall 42 or 44. The total length of the tethers 56A, 56B may be approximately 20-25 mm, but may extend to any length without deviating from the spirit of the invention.

The cross-sectional shape of the tethers 56A, 56B and/or their associated barbs 64 may differ from one another to easily differentiate the long legs 60 and the short legs 62 of the O-ring body 54 from one another to assist the user in installing the correct or matching leg of the O-ring body 54 to the corresponding side of the cover 26. In one embodiment, the tethers 56A of the long legs 60 and their barbs 64 may have an oblong cross-section and the tethers 56B of the short legs 62 may have a circular cross-section. In this respect, the oblong tethers 56A of the long legs 60 will fit into oblong holes 52A of the long sidewalls 42 of the cover 26, and the round tethers 56B of the short legs 62 will fit into round holes 52B of the short sidewalls 44 of the cover 26. It is understood that the cross-sectional shape of each tether 56A, 56B and/or its barb 64 may vary so long as it generally corresponds with the shape of the hole 52A, 52B so that like-shaped tethers fit into like-shaped holes.

Figure 9:
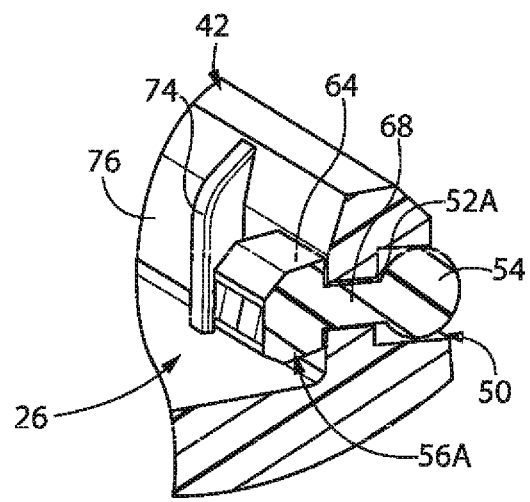
FIG. 9 is an enlarged cross-sectional view of the O-ring installed within the channel along the long side of the cover.
Figure 10:
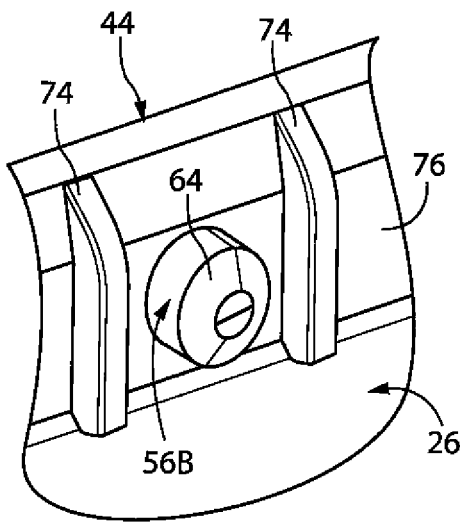
FIG. 10 is an enlarged view of the cut tether on an inner side of the cover and at the short side of the cover.
Figure 11:
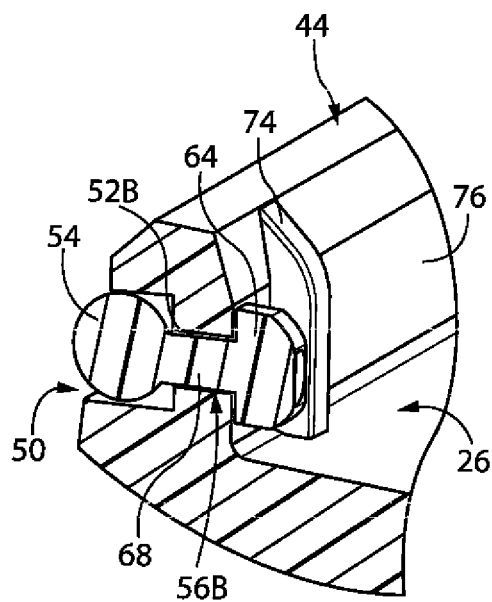
FIG. 11 is an enlarged cross-sectional view of the O-ring installed within the channel along the short side of the cover.

As best seen in FIGS. 9 and 11, each barb 64 has a diameter greater than the remainder of the associated stem 68. The barb 64 may be shaped similar to the remainder of tether 56A or 56B, but is larger in cross-sectional area so that, once the barb 64 is pulled through the hole 52A or 52B, extraction of the barb 64 from the hole is difficult. The stem 68 may have a length of approximately 2.5-3 mm, or 2.7 mm which generally corresponds with, but preferably is slightly less than, a depth of the hole 52A or 52B of the cover 26.

Referring to FIGS. 2-4 and 11, the tether leader 66 assists in the installation of the tether 56A or 56B through the holes 52A or 52B but is later removed, as will be described further below. The tether leader 66 shape and size may be generally consistent with those of the stem 68 at the proximal end of the tether 56A or 56B, being of a smaller cross-section area than the barb 64. The leader 66 should be sufficiently long to easily grasp with one's fingers and pull the barb 64 through the associated hole 52A or 52B in the cover 26. That length may be, for example, about 15-20 mm.

Referring also to FIGS. 9 and 11, enlarged cross-sectional views of the channel 50 of the cover 26 are shown. The O-ring body 54 is seated within the channel 50 such that, when the cover 26 is coupled to the housing 22, the inner surface of O-ring body 54 is compressed within the channel 50 and the outer surface of O-ring body 54 is compressed against the mating wall 34 or 36 of the housing 22 (FIG. 1), creating a seal.

Referring to FIGS. 2, 9, and 11 each hole 52A, 52B is of a larger in area than that of the stem 68 and leader 66 the associated tether 56A or 56B so that each tether 56A or 56B may fit within the hole 52A or 52 B. Each hole 52A or 52B is smaller in cross-sectional area than that the associated barb 64 so that the barb 64 may squeeze through the corresponding hole 52A or 52B, but will be difficult to remove from the hole 52A or 52B once inserted therethrough. Each hole 52A or 52B is shaped to correspond to the cross-sectional shape of the associated tether 56A or 56B. Thus, the hole 52A in each major sidewall 42 of the cover 26 is oblong in shape, and the hole 52B in each minor side 44 of the cover 26 is circular. The correspondence between hole shape and the tether shape on each side of the cover 26 assists in making sure the major 60 and minor 62 legs of the tether O-ring body 54 are mounted on the major 42 and minor sidewalls 44 of the cover 26.

We now proceed to describe installation of the O-ring 28 to the cover 26 and the cover 26 to the housing 22 of the electronic device 20. Referring now to FIGS. 3 and 4, in order to assist in the assembly of the O-ring 28 to the cover 26, the user places a first tether 56A on the long leg 60 of the O-ring body 54 into a first hole 52A of the long sidewall 42 of the cover 26. The tether 56A is pulled through the hole 52A until the barb 64 of the tether 56A is on the opposite side of the cover sidewall 42 as the body 54 of O-ring 28, or on the inner surface 76 of the cover sidewall 42. The user then stretches the O-ring body 54 and continues to place a second tether 56A on the opposite long leg 60 of the O-ring body 54 into a second hole 52A of the opposite long sidewall 42 of the cover 26. The tether 56A is pulled through the hole 52A until the barb 64 of the tether 56A is on the opposite side of the cover sidewall 42 as the O-ring body 54, or on the inner surface of sidewall 42. The mating cross-sectional shape of the tether 56A and the hole 52A facilitates proper orientation of the O-ring body 54 with the cover 26.

Next, in FIG. 4, the user stretches the O-ring body 54 to place a third tether 56B on the short leg 62 of the O-ring 28 into a third hole 52B of the short sidewall 44 of the cover 26. The tether 56B is pulled through the hole 52B until the barb 64 of the tether 56B is on the opposite side of the cover sidewall 44 as the O-ring body 54, or on the inner surface of sidewall 44. The user then stretches the O-ring body 54 and continues to place a fourth tether 56B on the opposite short leg 62 of the O-ring body 54 into a fourth hole 52B of the opposite short sidewall 44 of the cover 26. The tether 56B is pulled through the hole 52B until the barb 64 of the tether 56B is on the opposite side of the cover sidewall 44 as the O-ring body 54, or on the inner surface 76 of the cover sidewall 44. The round tethers 56B fit through the round holes 52B of the short sidewalls 44. The O-ring body 54 now takes a generally diamond shape as it is attached at four points spaced around the cover 26. It is understood that the tethers 56A and 56B may be installed in any order, such as installing the tethers 56B of the short sidewalls 44 first and then installing the tethers 56A of the long sidewalls 42.

Figure 5:
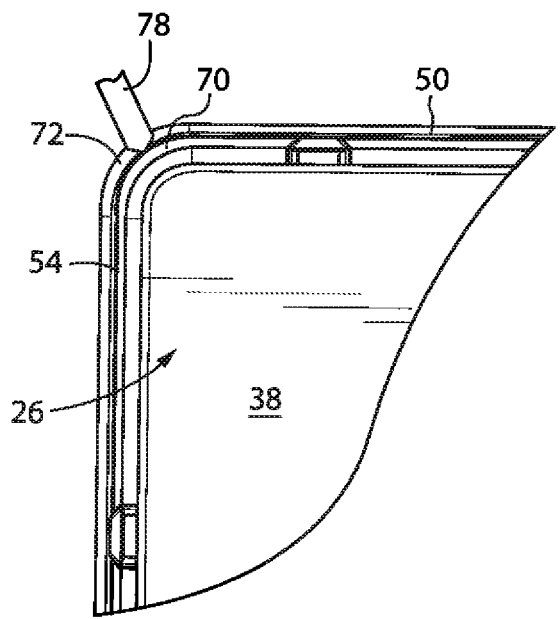
FIG. 5 is an enlarged view of a corner of the cover showing a tool placing a corner of the O-ring body into a corner of the channel.

Once all four tethers 56A, 56B are inserted into the corresponding holes 52A, 52B, the remainder of the O-ring body 54 may be installed. Referring now to FIG. 5, an enlarged view of a corner of the cover 26 is shown. The user installs the corners 70 of the O-ring body 54 into the channel 50 by stretching the corners 70 of the O-ring body 54 into the corners 72 of the channel 50. The user may be assisted by a tool 78, such as tweezers or a needle nose pliers.

Still referring to FIG. 5, the corners 70 of the O-ring body 54 may be molded or shaped to the corners 72 of the channel 50 so that the O-ring body 54 fits within the corners 72 of the cover 26 evenly. While the application of a circular O-ring body 54 around a circular perimeter typically results in the O-ring body 54 normalizing to a constant cross-section, the corners of a rectangular cover 26 make it difficult for the O-ring body 54 to normalize due to the O-ring body 54 being stuck in the tight radii of the corners 72 of the cover 26. Thus, the use of a rectangular molded O-ring body 54 prevents or at least reduces localized bending at the corners 70 of a circular O-ring body 54, which would cause a thinner cross-section to be formed at the higher friction points at the corners 70 upon stretching of the O-ring body 54.

Still referring to FIG. 5, by aligning the four points (or other number of points such as two, three, five, six, etc.) of the O-ring 28 around the cover 26, the O-ring body 54 is evenly aligned around the channel 50, and the remainder of the O-ring body 54 can be evenly stretched around the remainder of the channel 50. Typically, without the alignment of the four points, stretching of an O-ring body 54 is uneven due to friction. The friction of the channel 50 against that O-ring body 54 may also cause the O-ring body 54 to become twisted or stretched unevenly, resulting in an uneven and non-uniform diameter around the cover 26. Also, the act of stretching the O-ring body 54 around one side of the cover 26 first, then a second side of the cover 26 second, results in varying amounts of elastic stretch along the four sides of the cover 26. This is avoided by tethering the rectangular O-ring 28 at dispersed points around the cover 26, and then installing the molded corners 70 of the rectangular O-ring body 54 evenly into the corners 72 of the channel 50.

Figure 6:
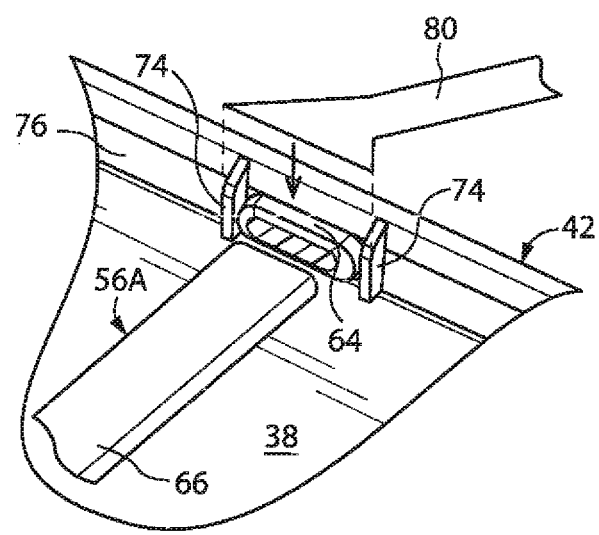
FIG. 6 is an enlarged view of a hole opening on an inner side of the cover and showing the associated tether being cut along guides and the excess tether leader detached.

Referring now to FIG. 6, the tether leaders 66 preferably are removed after installation of the O-ring 28 so as not to interfere with the contents of the opening 24. The user can cut or trim the tether 56A or 56B to remove the distal tether leaders 66 while leaving the barbs 64 intact with the proximal tether portion and the O-ring body 54. To facilitate this cutting, a pair of guides 74 may be positioned on either side of each hole 52A, 52B on the inner surface of the associated cover sidewall 42 or 44. The guides 74 may be plastic slats that extend inwardly from the inner surface 76 of the associated sidewalls 42, 44 by a distance that is the same as or slightly greater than the depth of the associated barb 64. Each pair of guides 74 is spaced horizontally from one another by a distance that is slightly greater than the width of the associated barb 64. The user aligns a cutting instrument 80, such as a knife or blade, along the outer edges of the guides 74 and cuts downward such that the cutting instrument 80 cuts parallel to the inner side 76 of the cover 26 to remove the excess tether leaders 66. The tether leaders 66 may then be discarded. Referring also to FIGS. 8-11, once the tether leaders 66 are cut, the barb 64 remains with the proximal tether portion so as to hold the O-ring 28 in place. The remaining tether portions 56A or 56B retain the positioning of the O-ring 28 so that the O-ring body 54 does not slide along the channel 50. Also, the remaining tether portions 56A or 56B prevent the O-ring body 54 from being inadvertently lifted or removed from the channel 50 by the user.

Figure 7:
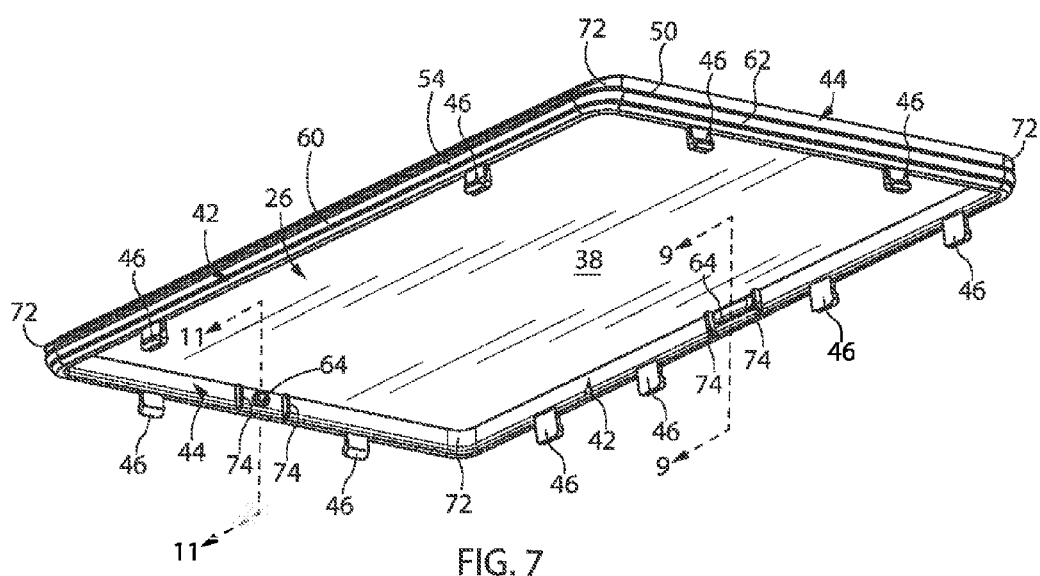
FIG. 7 is an isometric view of the cover viewed from below the cover and showing the O-ring installed on the cover.
Figure 8:
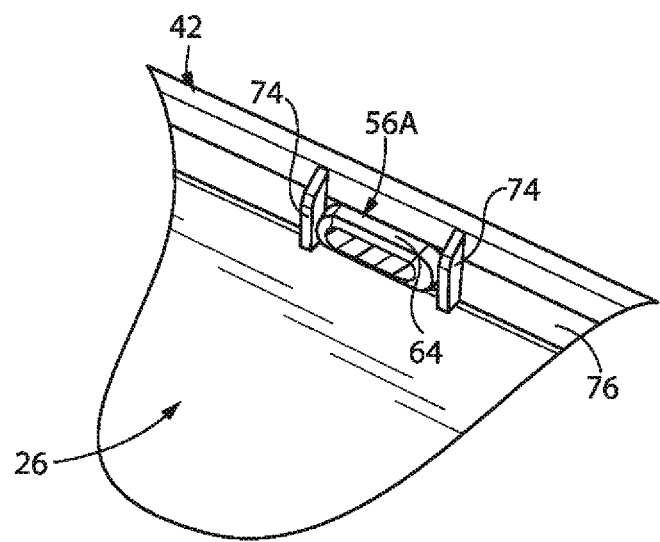
FIG. 8 is an enlarged view of the cut tether on an inner side of the cover and at the long side of the cover.

Referring now to FIG. 7, an isometric view of the cover 26 as viewed from below the cover 26 and showing the O-ring 28 installed on the cover 26 is shown. The cover 26 is now ready and may then be installed onto the housing 22 so as to enclose the cover opening 24. This may be accomplished by placing latches 46 of the cover 26 within slots 48 of the housing 22 or otherwise mating couplers on the cover 26 and the housing 22. Once the cover 26 is coupled to the housing 22, the O-ring 28 creates a seal between the cover 26 and the housing 22.

The user may remove and reinstall the cover 26 as desired, for example, to replace the batteries (not shown) or perform maintenance on the housing 22's internal components. However, the user does not need to detach the O-ring 28 from the cover 26 during removal and installation of the cover 26. The O-ring 28 should remain in position during the removal and installation of the cover 26.

It is contemplated that an alternative embodiment may incorporate any of the features of the previous embodiment described above.

Many other changes and modifications could be made to the invention without departing from the spirit thereof.

For example, the length, positioning, and number of the tethers 56A, 56B cm the O-ring 28 may vary, while still allowing the O-ring 28 to be attached to the cover 26 at multiple points and installed on the cover 26 in an even manner. For example, the O-ring 28 may include one, two, three, four, five, six, etc. tethers 56A, 56B which tether the O-ring 28 to the cover 26 during installation. The length, positioning, and number of tethers 56A, 56B may differ depending on the size and shape of the cover 26.

Also, the shape of the cover 26 and O-ring body 54 may vary. For example the cover 26 may have a triangular, rectangular, round, or other shape. However, regardless of the shape, the O-ring body 54 preferably should generally correspond to the shape of the cover 26 and/or channel 50 so that the O-ring 28 is evenly installed thereon.

The scope of these changes and modifications will become apparent from the appended claims.

What we claim is:

1. A method of sealing an electronic device, comprising the steps of: providing a housing presenting an opening bounded by circumferential walls; providing a cover having walls extending circumferentially around the cover and positionable within the recess at a location inboard of the housing walls, the walls of the cover having a channel extending around an outer perimeter of the cover walls and at least two holes formed therethrough from an inner surface of the channel; providing an O-ring having a body and at least two tethers extending inwardly from the body, wherein the O-ring body has first and second legs that are opposed with respect to one another and third and fourth legs that are opposed with respect to one another, wherein the cover has first and second walls that are opposed with respect to one another and third and fourth walls that are opposed with respect to one another, wherein the first and second tethers extend inwardly from the respective first and second legs of the O-ring body and are of a first cross-sectional shape that matches that of corresponding holes in the associated first and second walls of the cover, and wherein third and fourth tethers extend inwardly from the respective third and fourth legs of the O-ring body and are of a second cross-sectional shape that matches that of corresponding holes in associated third and fourth walls of the cover and that is different from the first cross-sectional shape; aligning like-shape tethers of the O-ring with like-shaped holes in the walls of the cover; inserting the tethers on the O-ring through the corresponding holes in the walls of the cover; stretching the O-ring body around the walls of the channel; and placing the cover over the opening so that the O-ring creates a seal between the walls of the housing and the walls of the cover.

2. The method of claim 1, wherein the cover is rectangular and the O-ring body has an at least generally rectangular shape when in its relaxed state.

3. The method of claim 1, further comprising the step of inserting a locking barb of each tether through a corresponding hole in the cover, the locking barb having a larger cross-sectional area than that of the hole.

4. The method of claim 3, further comprising the step of trimming a distal end of each tether while leaving the locking barb intact.

5. An electronic device comprising: a housing having a recess bounded by circumferential walls; a cover concealing the recess and having walls extending circumferentially around the cover and into the recess at a location inboard of the housing walls and having a channel formed in an outer surface thereof, at least two through-holes being formed through the walls from an inner surface of the channel; and an O-ring having a body with at least two tethers each of which passes through a respective hole in the cover, the O-ring body being mounted in the channel and sealing against the walls of the housing, wherein the O-ring body has first and second opposed legs and third and fourth opposed legs, wherein the cover has first and second opposed walls and third and fourth opposed walls, wherein the tethers include first and second tethers that extend inwardly from the respective first and second legs of the O-ring body and that are of a first cross-sectional shape that matches that of corresponding holes in the associated first and second walls of the cover, and wherein the tethers include third and fourth tethers that extend inwardly from the respective third and fourth legs of the O-ring body and that are of a second cross-sectional shape that is different from the first cross-sectional shape and that matches that of corresponding holes in the associated third and fourth walls of the cover.

6. The device of claim 5, wherein each of the tethers has a locking barb located between the body and an inner distal end of the tether and having a cross-sectional area greater than that of the corresponding hole.

7. The device of claim 6, wherein each tether further comprises a leader extending from the locking barb to the inner distal end of the tether.

8. The device of claim 6, wherein the cover is rectangular and the O-ring body has an at least generally rectangular shape when in a relaxed state thereof.

9. The device of claim 8, wherein the first, second, third, and fourth tethers are evenly spaced around the O-ring.

10. The device of claim 8, wherein corners of the O-ring body are molded to conform to corners of the cover walls.

11. An O-ring for sealing a cover of an electronics device to a housing of the electronics device, the O-ring comprising: a body being formed of an elastomeric material, the body forming a loop and being configured to be mounted in an outer peripheral channel formed in circumferential sidewalls of the cover and to seal against inner surfaces of circumferential sidewalls of the housing; and at least two tethers formed integrally with the body and extending inwardly from opposite sides of the body, each tether being configured to be inserted through a through-hole extending inwardly from the channel in the cover walls, wherein the O-ring body has first and second legs that are opposed with respect to one another and third and fourth legs that are opposed with respect to one another, wherein the tethers include first and second tethers that extend inwardly from the respective first and second legs of the O-ring body and that are of a first cross-sectional shape, and wherein the tethers include third and fourth tethers that extend inwardly from the respective third and fourth legs of the O-ring body and that are of a second cross-sectional shape that is different than the first cross-sectional shape.

12. The O-ring of claim 11, wherein each of the tethers has a locking barb located between the body and an inner distal end of the tether and having a cross-sectional area greater than that of the corresponding hole in the cover wall.

13. The O-ring of claim 12, wherein each tether further comprises a leader extending from the locking barb to the inner distal end of the tether.

14. The O-ring of claim 11, wherein the O-ring body has an at least generally rectangular shape when in a relaxed state thereof.

15. The O-ring of claim 11, wherein the corners of the O-ring body are molded to conform to corners of the cover walls.

* * * * *